(12) United States Patent
Lin (10) Patent No.: US 7,449,939 B2
(45) Date of Patent: Nov. 11, 2008

(54) BIAS GENERATOR WITH FEEDBACK CONTROL

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/895,419

(22) Filed: Aug. 24, 2007

(65) Prior Publication Data

US 2008/0042739 A1 Feb. 21, 2008

Related U.S. Application Data

(62) Division of application No. 11/193,257, filed on Jul. 29, 2005, now Pat. No. 7,282,972.

(51) Int. Cl.
*G05F 1/10* (2006.01)
(52) U.S. Cl. .................................... 327/538; 327/540
(58) Field of Classification Search .......... 327/155, 327/538, 540
See application file for complete search history.

(56) References Cited

U.S. PATENT DOCUMENTS

| | | | | |
|---|---|---|---|---|
| 4,484,152 | A | 11/1984 | Lee | 331/1 A |
| 5,381,177 | A | 1/1995 | Noguchi et al. | 348/313 |
| 5,761,108 | A | 6/1998 | Martin | 365/49 |
| 5,770,975 | A | 6/1998 | Saito | 331/1 R |
| 5,874,863 | A | 2/1999 | Wojewoda et al. | 331/17 |
| 5,939,949 | A | 8/1999 | Olgaard et al. | 331/17 |
| 6,211,740 | B1 | 4/2001 | Dai et al. | 331/2 |
| 6,229,774 | B1 | 5/2001 | Yasuda | 369/47.28 |
| 6,313,675 | B1 | 11/2001 | Naffziger | 327/158 |
| 6,316,976 | B1 | 11/2001 | Miller, Jr. et al. | 327/156 |
| 6,333,670 | B1 * | 12/2001 | Kono et al. | 327/541 |
| 6,388,480 | B1 | 5/2002 | Stubbs et al. | 327/156 |
| 6,407,600 | B1 | 6/2002 | Lu et al. | 327/156 |
| 6,445,234 | B1 | 9/2002 | Yoon et al. | 327/161 |
| 6,504,408 | B1 | 1/2003 | von Kaenel | 327/158 |
| 6,580,287 | B2 | 6/2003 | Hsu et al. | 326/32 |
| 6,614,275 | B1 | 9/2003 | Amick et al. | 327/158 |
| 6,639,958 | B1 | 10/2003 | Höhler et al. | 375/376 |
| 6,642,762 | B2 | 11/2003 | von Kaenel | 327/158 |
| 6,650,661 | B1 | 11/2003 | Buchanan et al. | 370/516 |
| 6,683,478 | B2 | 1/2004 | Yoo | 327/12 |
| 6,727,739 | B2 | 4/2004 | Stubbs et al. | 327/161 |
| 6,791,381 | B2 | 9/2004 | Stubbs et al. | 327/156 |
| 6,845,459 | B2 | 1/2005 | Lin | 713/401 |
| 6,856,203 | B2 | 2/2005 | Dey | 331/16 |
| 6,900,685 | B2 | 5/2005 | Silvestri | 327/276 |
| 6,914,490 | B2 | 7/2005 | Fayneh et al. | 331/16 |
| 6,924,680 | B2 | 8/2005 | Knüpfer | 327/158 |
| 6,930,955 | B2 | 8/2005 | Johnson et al. | 365/233 |
| 6,940,768 | B2 | 9/2005 | Dahlberg et al. | 365/201 |
| 6,956,413 | B2 * | 10/2005 | Bailey | 327/131 |
| 6,976,184 | B2 | 12/2005 | Hartwell | 713/500 |
| 6,980,037 | B1 | 12/2005 | Page et al. | 327/143 |
| 6,985,016 | B2 | 1/2006 | Chow et al. | 327/149 |
| 7,138,852 | B2 * | 11/2006 | Miyazaki et al. | 327/534 |
| 7,161,398 | B2 | 1/2007 | Park et al. | 327/149 |

* cited by examiner

*Primary Examiner*—Kenneth B. Wells
(74) *Attorney, Agent, or Firm*—Dorsey & Whitney LLP (57) ABSTRACT

A bias generator for initializing a voltage controlled delay line by providing the voltage controlled delay line with a control signal having an initial voltage and monitoring the variable delay line for an output clock signal. The voltage of the control signal is varied from the initial voltage until an output clock signal from the voltage controlled delay line is detected by the bias generator.

18 Claims, 7 Drawing Sheets

FIGURE 1

PRIOR ART

BIAS GENERATOR WITH FEEDBACK CONTROL

CROSS-REFERENCE TO RELATED APPLICATIONS

This application is a divisional of U.S. patent application Ser. No. 11/193,257, filed Jul. 29, 2005, now U.S. Pat. No. 7,282,972.

TECHNICAL FIELD

This invention relates to clock synchronization circuits, and, more particularly, to a bias generator circuit for a clock synchronization circuit having a voltage controlled delay circuit that provides a variable initial bias signal to set an initial delay of the voltage controlled delay circuit.

BACKGROUND OF THE INVENTION

Figure 1:
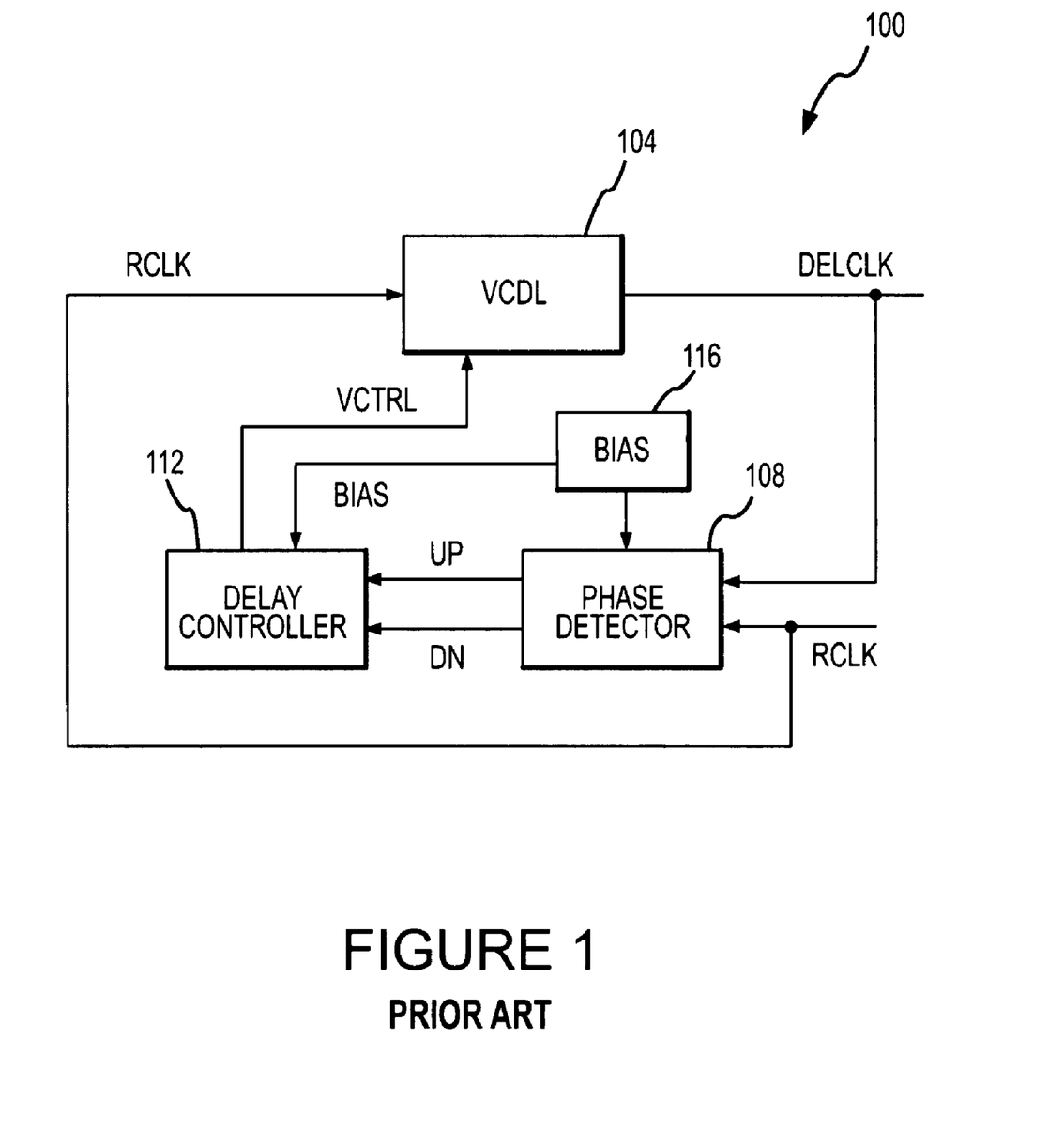
FIG. 1 is a functional block diagram of a conventional DLL.

In many electronic circuits, it is necessary to generate internal clocks with predetermined phase relationships to a reference clock. Clock synchronization circuits such as phase locked loops (PLLs) or delay locked loops (DLLs) are often used to generate an internal clock signal that is synchronized, or in phase, with a reference clock signal. FIG. 1 is a functional block diagram of a conventional DLL 100. The DLL 100 includes a voltage controlled delay line (VCDL) 104 that receives a reference clock (RCLK) signal, and in response, generates a delayed clock (DELCLK) signal having a delay relative to the RCLK signal that is based on a voltage of a voltage control (VCTRL) signal. The DLL 100 also includes a phase detector (PD) 108 that receives the RCLK and DELCLK signals and generates UP and DN control signals. The respective values of the UP and DN signals depend on the phase difference between the RCLK and DELCLK signals. For example, if the DELCLK signal leads the RCLK signal, the DN signal goes high and remains high until the next rising edge of the RCLK signal, while the UP signal remains low. If the DELCLK signal lags the RCLK signal, the UP signal goes high and remains high until the next rising edge of the DELCLK signal, while the DN signal remains low. A delay controller 112 generates the VCTRL signal in response to the UP and DN signals from the PD 108. In operation, the delay controller 112 applies the VCTRL signal to the VCDL 104 to adjust the variable delay of the VCDL 104 until the RCLK and DELCLK signals are in phase, as detected by the PD 108. Under this condition, the DLL 100 is referred to as being "locked."

A bias generator 116 included in the DLL 100 applies a constant BIAS signal to the delay controller 112 and is coupled to the PD 108 to disable it during initialization of the DLL 100. During power-up or reset of the DLL 100, the PD 108 is disabled by the bias generator 116 by, for example, the use of an active DISABLE signal. When the PD 108 is disabled, the delay controller 112 generates the VCTRL signal in response to the BIAS signal provided by the bias generator 116. The BIAS signal has a constant voltage that is used by the delay controller 112 to set an initial voltage for the VCTRL signal applied to the VCDL 104. In response, the VCDL 104 generates a DELCLK signal having an initial delay set by the voltage of the VCTRL signal. After the start-up or reset, and the DLL 100 has been initialized, the BIAS signal is no longer provided to the delay controller 112 and the PD 108 is enabled by the bias generator 116. Following initialization, the DLL 100 operates as previously described.

Figure 2:
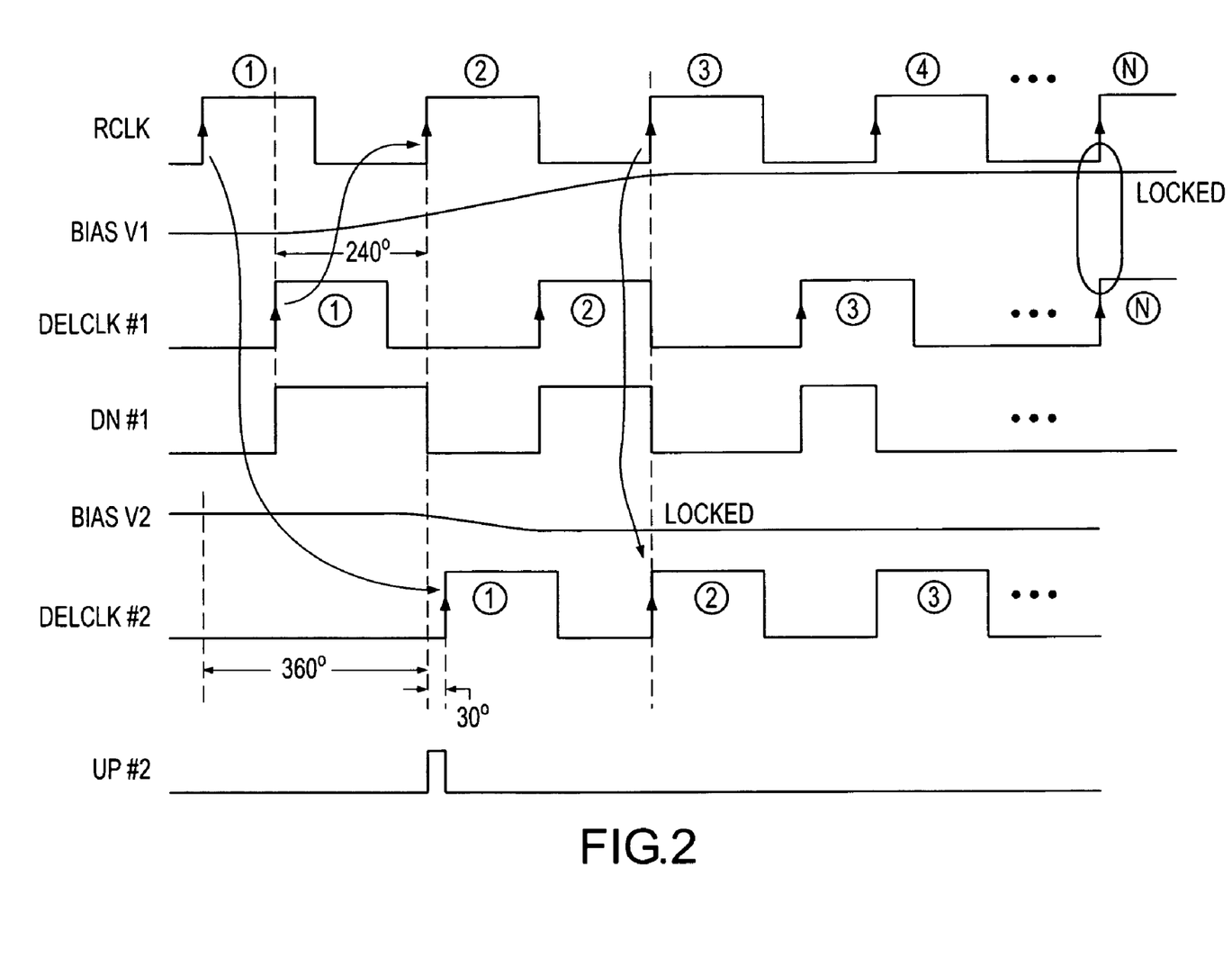
FIG. 2 is a timing diagram of various signals generated during the initialization of the DLL of FIG. 1.

FIG. 2 shows various signals generated during power-up and thereafter by the DLL 100. Shortly after the DLL 100 is reset, the delay controller 112 generates a VCTRL signal to set an initial delay for the VCDL 104 in response to the bias generator 116 (shown in FIG. 1) applying a BIAS signal having a voltage V1. The VCDL generates the DELCLK#1 signal having an initial delay relative to the RCLK signal. In the example of FIG. 2, the DELCLK#1 signal initially leads the RCLK signal by 240 degrees, corresponding to the voltage of the BIAS signal establishing an initial voltage V1 for the VCTRL signal, which results in an initial delay that creates a 240 degrees phase difference between the DELCLK#1 signal and the RCLK signal.

Next, after the DLL 100 has been initialized, the BIAS signal is removed and the PD 108 is enabled. The PD 108 compares the phase of the DELCLK#1 signal to the phase of the RCLK signal and generates the UP and DN signals accordingly. As will be understood by those skilled in the art, since the DELCLK#1 signal leads the RCLK signal, the PD 108 generates DN#1 signal responsive to the phase difference between the DELCLK#1 and RCLK signals. In response to the DN#1 signal, the delay controller 112 generates the VCTRL signal (not shown) that is used to adjust the phase delay of the DELCLK#1 signal until the phase difference between the DELCLK#1 signal and the RCLK signal is eliminated. As shown in FIG. 2, the phase delay of the DELCLK#1 is increased responsive to the DN#1 signal until the phase difference between the DELCLK#1 signal and the RCLK signal is 360 degrees. When the DLL 100 is locked, the delay between RCLK and DELCLK#1 signal is equal to one clock cycle. In FIG. 2, the PD 108 will force the delay controller to add delay to the DELCLK signal.

FIG. 2 also shows various signals generated when a BIAS signal having a voltage V2 is applied to the delay controller 112, which in turn generates a VCTRL signal having an initial voltage to set an initial delay of the VCDL 104. In response to the VCTRL signal having a voltage set by the voltage V2 of the BIAS signal, the VCDL 104 generates the DELCLK#2 signal that lags the RCLK signal by 30 degrees. Thus, in the example of FIG. 2, the BIAS signal having a voltage V2 results in an initial delay that creates a 30 degrees phase difference between the DELCLK#2 signal and the RCLK signal. As shown in FIG. 2, the phase delay of the DELCLK#2 is increased responsive to the UP#1 signal until the phase difference between the DELCLK#2 signal and the RCLK signal is eliminated by the third cycle. In comparison to the previous example, applying the BIAS signal having a voltage V2 results in the DLL 100 obtaining a lock condition sooner than a BIAS signal having a voltage V1.

FIG. 2 illustrates that the amount of time required to eliminate the phase difference between the DELCLK and RCLK signals depends on, among other things, the voltage of the BIAS signal applied during initialization of the DLL 100, which in turn is used to establish an initial voltage of the VCTRL signal applied to the VCDL 104 to set an initial delay. Therefore, selecting a voltage for the BIAS signal that reduces the time required to eliminate the phase difference is desirable. If the voltage of the BIAS signal is not selected properly, it may require a relatively long period of time for the DLL 100 to eliminate the phase difference.

Selection of a proper initial bias voltage is also important because of the effects of process variations in semiconductor integrated circuits (ICs). The process variations refer to variations in semiconductor fabrication processing steps such as, for example, ion implantation, deposition, lithography and etching that affect the performance of ICs. Voltage and temperature variations also affect the performance of ICs.

It can be difficult to select a voltage for the BIAS signal that will result in the DLL 100 acquiring lock quickly in every operating condition. For example, the voltage of the BIAS signal may be sufficient to facilitate the DLL 100 quickly acquiring lock under some voltage, temperature, and frequency operating conditions, but given a different set of operating conditions, it may take significantly longer for the DLL 100 to acquire lock. Although it is known that semiconductor devices behave differently under different operating conditions, process variations may cause circuits inside the VCDL 104 to behave significantly different under the different voltage or temperature conditions. The delay stages inside the VCDL 104 may be faster under one set of operating conditions, but may be too slow under another set of operating conditions to pass high speed signals at the specific voltage or at the specific temperature. As illustrated by the present example, given different voltage and temperature operating conditions, the voltage of the BIAS signal that is used to establish the initial voltage of the VCTRL signal applied to the VCDL 104 may be sufficient for one set of operating conditions but insufficient for another.

Typically, the voltage of the BIAS signal is selected to establish the initial voltage of the VCTRL signal applied to the VCDL 104 to set an amount of the variable delay that is approximately 50% of the maximum delay of the VCDL 104. However, the process variations discussed above may cause the variable delay to have an initial delay that is far from the 50% maximum delay condition under some operating conditions. In a case where the process variations have caused a significant shift in operational characteristics of the VCDL 104, the VCDL 104 may fail to generate a DELCLK signal from the RCLK signal for the initial voltage of the VCTRL signal (as established by the BIAS signal) when operating under extreme operating conditions, but are still within the operational corners of variations in Process, Voltage, Temperature and Frequency (PVTF). For example, the VCDL 104 may be unable to generate a DELCLK signal in response to the RCLK signal at slow corners (i.e., slow process, low voltage, high temperature) and high clock frequency. Under these conditions, the output of the VCDL 104 may merely be a dc signal. Consequently, the PD 108 will not be able to compare the phase of the RCLK signal to the phase of the DELCLK signal, and the delay controller 112 will not correctly adjust the variable delay of the VCDL 104 because the UP and DN signals generated by the PD 108 do not accurately represent the phase difference of the DELCLK and RCLK signals.

Accordingly there is a need for a circuit that applies an initial bias voltage in a clock synchronization circuit, such as the DLL 100, that facilitates the rapid adjustment under various operating conditions of a voltage controlled delay circuit to eliminate the phase difference between a reference clock signal and a clock signal generated by the voltage controlled delay circuit in response to the reference clock signal.

SUMMARY OF THE INVENTION

One aspect of the invention is directed to a bias generator circuit in a clock synchronization circuit that generates a bias voltage signal. A voltage controlled delay line receives a voltage control signal and generates a delayed clock signal having a phase delay determined by the voltage control signal. The bias generator circuit receives the delayed clock signal and generates the bias voltage signal responsive to the delayed clock signal. A delay controller circuit receives the bias voltage signal and generates the voltage control signal. A comparison circuit receives the delayed clock signal and a reference clock signal and generates at least one comparison signal responsive to the relative phase difference between the delayed clock signal and the reference clock signal. The comparison circuit is disabled during power up and reset and is enabled when a valid delayed clock signal is detected. The delay controller circuit receives the comparison signal and generates the voltage control signal responsive to the comparison signal. The bias generator circuit varies the bias voltage signal until a valid delayed clock signal is detected. The bias voltage signal is removed from the delay controller circuit when a valid delayed clock signal is detected.

In another aspect of the invention, a voltage controlled delay line is initialized by providing the voltage controlled delay line with a control signal having an initial voltage and monitoring the variable delay line for an output clock signal. The voltage of the control signal is varied from the initial voltage until an output clock signal from the voltage controlled delay line is detected.

DETAILED DESCRIPTION OF PREFERRED EMBODIMENTS

Figure 3:
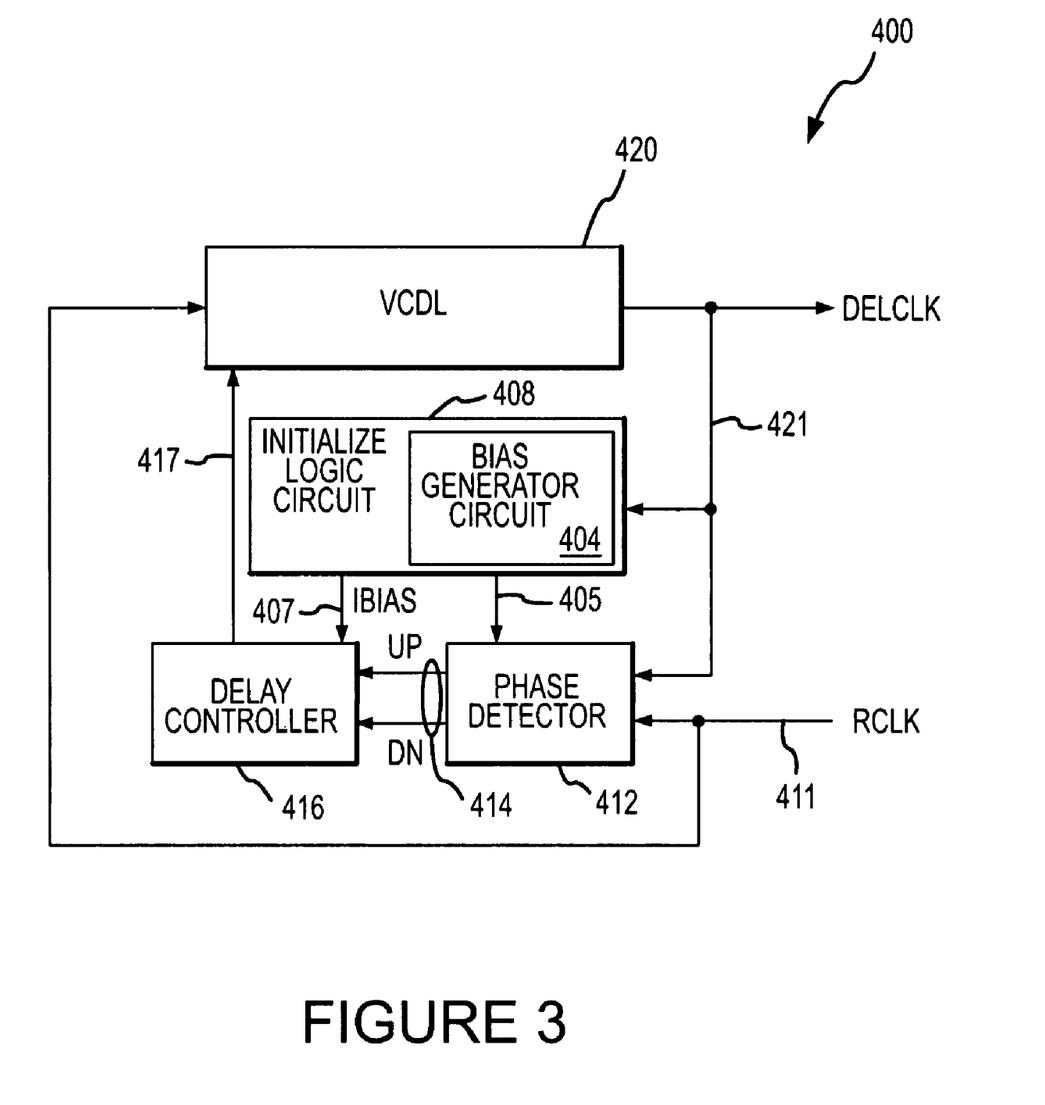
FIG. 3 is a functional block diagram illustrating a DLL including a bias generator circuit in accordance with one embodiment of the invention.

FIG. 3 is a functional block diagram illustrating a delay locked loop (DLL) 400 including a bias generator circuit 404 in accordance with one embodiment of the invention. As will be described in detail later, the bias generator circuit 404 operates to provide an initial bias voltage to a voltage controlled delay line that allows the DLL 400 to rapidly acquire a lock. It will be understood by those skilled in the art that the bias generator circuit 404 may be implemented in other clock generator circuits having voltage controlled timing elements, such as, for example, a voltage-controlled oscillator (VCO) or voltage-controlled delay line (VCDL).

The DLL 400 includes a VCDL 420 that receives a reference clock (RCLK) signal 411. In response to the RCLK signal, the VCDL 420 generates a delayed clock (DELCLK) signal 421 having a delay relative to the RCLK signal that is set by a VCTRL signal 417. The DLL 400 also includes a phase detector 412 coupled to the delay controller 416. The phase detector 412 receives the DELCLK signal 421 and the RCLK signal 411, and generates control signals, shown in FIG. 3 as UP and DN signals 414, responsive to the phase difference between the DELCLK signal and the RCLK signal. A delay controller 416 is coupled to the phase detector 412 and the VCDL 420 to generate the VCTRL signal 417 to adjust the delay of the VCDL 420 according to the UP and DN signals 414. As will be explained in more detail below, an initialize logic circuit 408 coupled to the VCDL 420 generates a disable signal 405 for disabling and enabling the phase detector 412. Alternatively, the phase detector 412 can be enabled and disabled through the use of an enable signal. The initialize logic 408 includes bias generator circuit 404 for generating a bias voltage signal IBIAS 407 that is provided to the delay controller 416 to establish the VCTRL signal 417 following initialization of the DLL 420.

In operation, during initial power up or reset of the DLL 400, the phase detector 412 is disabled by the initialize logic circuit 408 providing an active disable signal 405. The bias generator circuit 404 provides an IBIAS signal 407 to the delay controller 416, which in response, generates a VCTRL signal 417 according to the voltage of the IBIAS signal 407 to set an initial delay of the VCDL 420. In one embodiment of the invention, the IBIAS signal 407 has a magnitude of 0.5 Vcc, where Vcc is the supply voltage running the DLL 400. However, different voltages can be selected for the IBIAS signal 407 as well. Upon detecting a DELCLK signal output from the VCDL 420, the initialize logic circuit 408 disables the bias generator circuit 404 so that the IBIAS signal 407 is no longer provided to the delay controller 416 and further enables the phase detector 412 by changing the disable signal 405 to an inactive state.

When the phase detector 412 is enabled, the DLL 400 operates as a conventional DLL. That is, the phase detector 412 receives the DELCLK signal 421 and the RCLK signal 411, and generates UP and DN signals 414 responsive to the phase difference between the DELCLK signal 421 and the RCLK signal 411. The delay controller 416 generates a VCTRL signal 417 having a voltage according to the UP and DN signals 414. The VCTRL signal 417 is applied to the VCDL 420 to adjust the variable delay until the phase difference between the DELCLK signal 421 and the RCLK signal 411, as determined by the phase detector 412, is eliminated.

The previous example described operation of the DLL 400 under normal circumstances. However, due to process variations, as previously discussed, the VCDL 420 may be unable to generate a DELCLK signal 421 from the RCLK signal in response to the initial voltage of the VCTRL signal 417 for some voltage, temperature, and/or frequency conditions. That is, the VCDL 420 may not be able to generate a DELCLK signal 421 although receiving a stable RCLK signal at the initial voltage of the VCTRL signal 417, which is set according to the IBIAS signal 407. For example, under slow corner, low voltage and high speed conditions, and/or frequency conditions, the VCDL 420 may only be able to generate a dc signal or output a clock signal having an incorrect duty cycle when the VCTRL signal 417 having the initial voltage is applied. As will be understood by those skilled in the art, if the VCDL 420 fails to generate a DELCLK signal 421, the phase detector 412 will be unable to determine a phase difference relative to the RCLK signal 411 and will not generate the UP and DN signals 414 or will generate incorrect UP and DN signals. The result is that the delay controller 416 will fail to adjust the voltage of the VCTRL signal 417 or adjust it incorrectly since the UP and DN signals 414 are suspect, and the variable delay of the VCDL 420 will not change or change incorrectly. At best, the voltage of the VCTRL signal 417 will eventually change to a voltage that enables the VCDL 420 to generate a DELCLK signal 421 from the RCLK signal, which allows the phase detector 412 and the delay controller 416 to correctly adjust the delay of the VCDL 420 to put the DELCLK signal 421 and RCLK signal 411 in phase. However, even in the best case, the inability of the VCDL 420 to initially generate a DELCLK signal 421 from the RCLK signal 411 at the voltage of the initial VCTRL signal 417 significantly increases the time required to acquire a lock.

In embodiments of the present invention, after providing the delay controller with an IBIAS signal 407 having an initial voltage, the bias generator circuit 404 of the initialize logic circuit 408 monitors the output of the VCDL 420 for a DELCLK signal 421. If the bias generator circuit 404 does not detect a DELCLK signal 421, the bias generator circuit 404 varies the IBIAS signal 407. As the IBIAS signal 407 is varied, the output of the delay controller 416, i.e., the VCTRL signal 417, also varies. The VCTRL signal 417 is varied by varying the IBIAS signal 407 until a valid DELCLK signal 421 is detected by the bias generator 404. When a DELCLK signal 421 is detected, the initialize logic circuit 408 disables the bias generator 404 and enables the phase detector 412. Thus, the output of the VCDL 420, i.e., DELCLK signal 421, is used by the initialize logic 408 as a feedback signal to adjust the voltage of the VCTRL signal 417 (through the use of the IBIAS signal) until the VCDL 420 is capable of generating a DELCLK signal 421 from the RCLK signal. In one embodiment, the IBIAS signal is coupled to the VCDL 420 as the VCTRL signal 417 through a multiplexer (not shown) in the delay controller 416 that selects between the IBIAS signal and a control signal generated by the delay controller 416 in response to the UP and DN signals 414.

Figure 4:
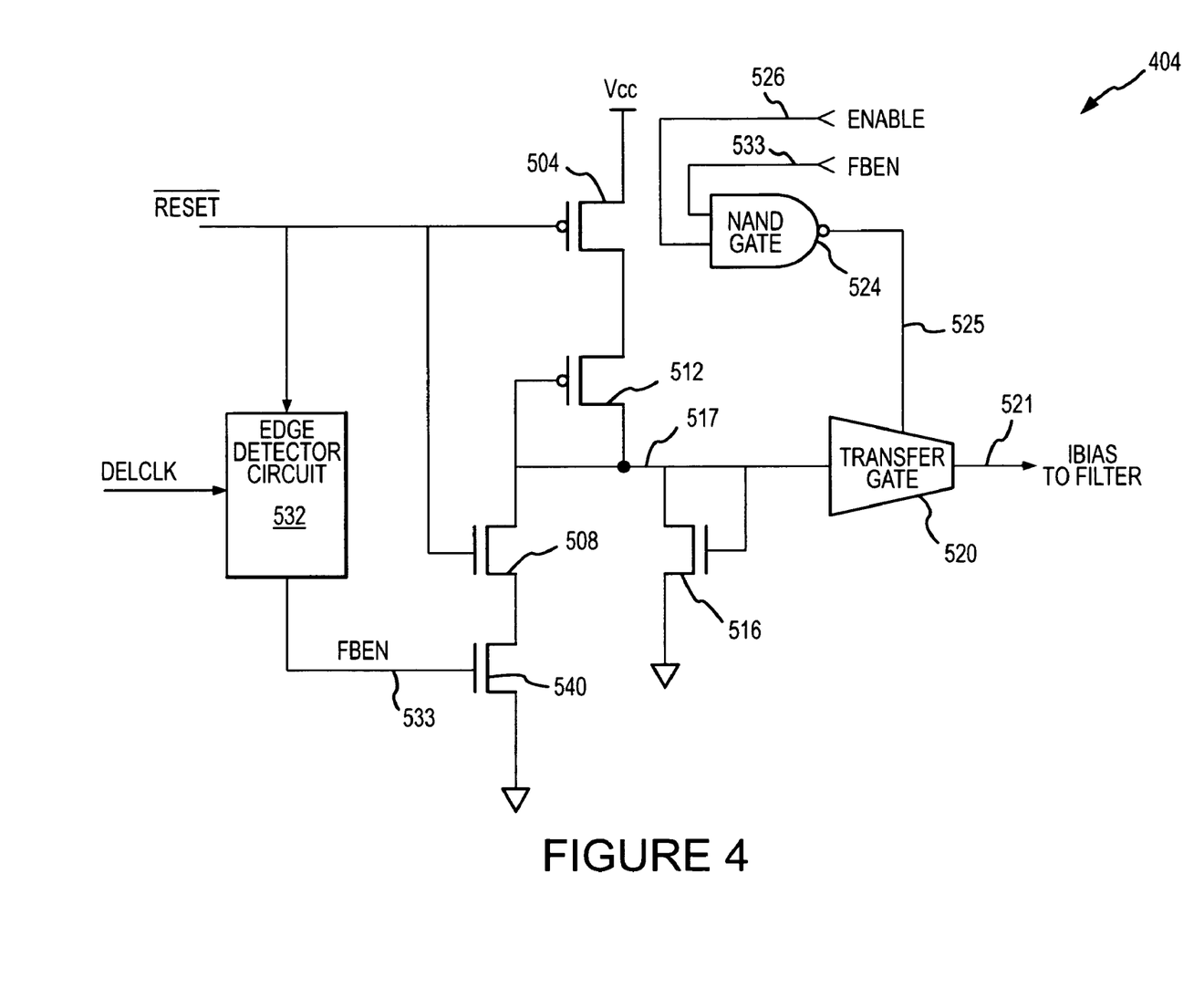
FIG. 4 is a circuit diagram of the bias generator circuit in accordance with one embodiment of the invention.

FIG. 4 is a detailed circuit diagram of the bias generator circuit 404 (shown in FIG. 3) in accordance with one embodiment of the invention. The bias generator circuit 404 includes a transfer gate 520 having an input node 517 coupled to ground through a diode-coupled n-channel metal-oxide semiconductor (NMOS) transistor 516 and coupled to a voltage supply VCC through a diode-coupled p-channel metal-oxide semiconductor (PMOS) transistor 512 and a precharge transistor 504. The input node 517 of the transfer gate 520 is further coupled to ground through a discharge path having transistors 508 and 540 coupled in series. The transfer gate 520 has a control node coupled to an output of a Boolean logic NAND gate 524 that provides an activation signal for the transfer gate 520. The NAND gate generates the activation signal in response to a feedback enable signal FBEN and an enable signal ENABLE. In the embodiment shown in FIG. 4, the transfer gate 520 couples the input node 517 to an output node 521 in response to the NAND gate 524 providing a signal having a low logic level.

The ENABLE signal can be generated from the disable signal used to disable the phase detector 412, with the ENABLE signal having a logic level corresponding to the logic level of the disable signal. That is, the ENABLE signal has high logic level while the phase detector 412 is disabled and has a low logic level when the phase detector 412 is enabled by the initialize logic circuit 408. The FBEN signal is generated by an edge detector circuit 532 included in the bias generator circuit 404. The edge detector circuit 532 shown in FIG. 4 is a rising edge detector. However, the bias generator circuit 404 can be modified to employ a falling-edge or a first-edge detector as well. The edge detector circuit 532 receives the DELCLK signal generated by the VCDL 420 and further receives an active low reset signal RESET signal that is also applied to gates of the precharge transistor 504 and the transistor 508. The edge detector circuit 532 uses the rising edge of the DELCLK signal to clock a flip-flop (not shown) having the RESET signal as an input, and generates a FBEN signal having a logic level that is complementary to the logic level of the RESET signal. As will be explained in more detail below, the edge detector circuit 532 generates a FBEN signal having a high logic level until a rising edge of the DELCLK signal is detected, at which time, the FBEN signal generated by the edge detector circuit 532 switches to a low logic level by latching the RESET signal having a high logic level.

Figure 5:
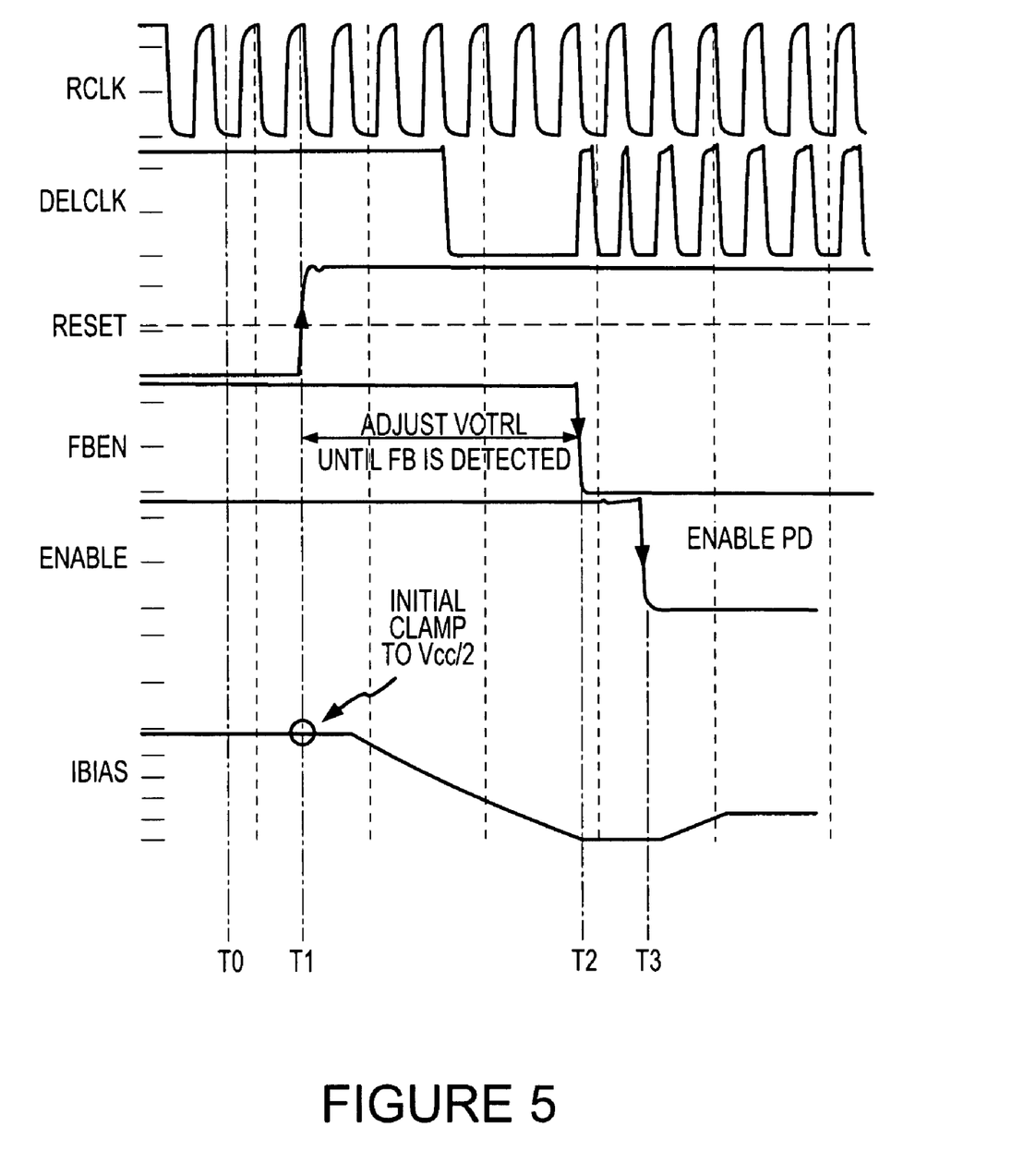
FIG. 5 is a timing diagram illustrating signals generated during the operation of the bias generator circuit.

Operation of the bias generator circuit 404 will be described with reference to FIG. 4 and the timing diagrams of FIG. 5. At a time T0, which represents a time shortly after the DLL 400 (shown in FIG. 3) is powered up or reset, the RESET signal has a low logic level. The RESET signal can be a low pulse signal, with the time T0 representing a time during the low pulse period of the RESET signal. As a result of the low logic level of the RESET signal, the transistor 504 turns on and the transistor 508 turns off. When the transistor 504 is turned on, transistors 512 and 516 are also turned on. As previously discussed, the transistors 512 and 516 are diode connected, and consequently, form a voltage divider. When the transistor 504 is on, the voltage Vcc is divided across the transistors 512 and 516 to establish an initial voltage at the input node 517 of the transfer gate 520, with the ratio of the impedances of transistors 512 and 516 establishing the fraction of the Vcc voltage at the input node 517. For the present example, the resistance of the transistors 512 and 516 are approximately equal, resulting in the voltage at the input node 517 being approximately Vcc/2, or one-half the Vcc voltage. Setting the voltage at the input node to Vcc/2 is helpful to reduce the lock time for most operating conditions. The voltage at the input node 517 is designated as the bias voltage signal 521. The device characteristics of the transistors 512 and 516 can be tailored to establish a different initial voltage of the bias voltage signal 521 if desired. Those ordinarily skilled in the art have sufficient understanding to make such modifications.

Also at the time T0, the ENABLE signal has a high logic level, corresponding to the high logic level of the active disable signal 512 (not shown in FIG. 5) generated by the initialize logic circuit 408 to disable the phase detector 412 (shown in FIG. 3). With the RESET signal low, and the edge detector 532 yet to detect a rising edge of the DELCLK signal, the FBEN signal has a high logic level. As a result, the NAND gate generates a signal having a low logic level that activates the transfer gate 520 so that the input node 517 is coupled to the output node 521. Since the input node 517 is clamped to a Vcc/2 voltage by the diode-coupled transistors 512 and 516, and will remain at Vcc/2 while the precharge transistor 504 remains on, the voltage at the output node 521 is Vcc/2. The Vcc/2 voltage represents the initial bias voltage output by the bias generator circuit 404 to establish an initial VCTRL signal 417 provided to the VCDL 420. As previously discussed, the initial bias voltage at the output node 521 can be set by scaling the diode coupled transistors 512, 516 accordingly.

At a time T1, the RESET signal switches to a high logic level, representing the end of the low pulse period of the RESET signal. The precharge transistor 504 switches off to decouple the input node 517 from the Vcc voltage supply. The transistor 508 switches on in response to the RESET signal switching high to begin decreasing the voltage of the input node 517 through the transistor 540, which has been on since at least the time T0. The rate at which the voltage of the input node 517 decreases is related to the device characteristics of the transistors 508 and 540, which can be tailored to provide a desired discharge rate. As previously discussed, the FBEN signal was high at the time T0, and will remain high at a time T1 if a rising edge of the DELCLK signal is not detected by the edge detector circuit 532. As shown in FIG. 5, the DELCLK signal remains at a dc level of approximately Vcc indicating that the initial bias voltage is insufficient to establish a VCTRL signal 417 that enables the VCDL 420 to generate a DELCLK signal. Thus, the FBEN signal remains high at the time T1. Additionally, since the ENABLE signal is also still high, the transfer gate 520 remains activated at the time T1. As a result, the voltage of the output node 521 begins to decrease as the voltage of the input node 517 decreases by virtue of the transistors 508, 540 being switched on.

In the time between the time T1 and a time T2, the voltage of the input node 517, and consequently, the IBIAS signal 407 of the output node 521 as well, continues to decrease. The VCTRL signal 417, having its voltage based on the IBIAS signal 407 at this time, also decreases, causing the variable delay of the VCDL 420 to be continually adjusted.

At the time T2, the voltage of the IBIAS signal 407, and consequently, the voltage of the VCTRL signal 417, is sufficient to enable the VCDL 420 to generate a rising edge of the DELCLK signal from the RCLK signal. In response to the rising edge of the DELCLK signal, the edge detector circuit 532 latches the high logic level of the RESET signal which causes the FBEN signal to switch to a low logic level. The transistor 540 is switched off by the FBEN signal having a low logic level, decoupling the input node 517 from ground to prevent the voltage of the input node 517 from further decreasing. Additionally, the low FBEN signal causes the NAND gate 524 to switch its output signal to a high logic level and deactivate the transfer gate 520. The output node 521 is decoupled from the input node 517, and the voltage of the IBIAS signal 407 no longer tracks the voltage of the input node 517. As a result, the VCTRL signal 417 is no longer controlled by the voltage of the IBIAS signal.

Shortly after the FBEN signal 533 switches low in response to the rising edge of the DELCLK signal, at a time T3, the initialize logic circuit 408 enables the phase detector 412 by switching the disable signal (not shown in FIG. 5) to a low logic level, which consequently causes the ENABLE signal to switch to a low logic level as well. With the VCTRL signal 417 no longer dependent on the voltage of the IBIAS signal and the phase detector 412 enabled, at the time T3 the DLL 400 operates in a conventional manner. That is, the delay controller 416 is free to vary the voltage of the VCTRL signal 417 based on the UP and DN signals generated by the phase detector 412 in response to the phase difference between the DELCLK signal and the RCLK signal. The VCTRL signal 417 is ultimately adjusted to a voltage that adjusts the variable delay of the VCDL 420 to provide a DELCLK signal that is in phase with the RCLK signal.

Figure 6:
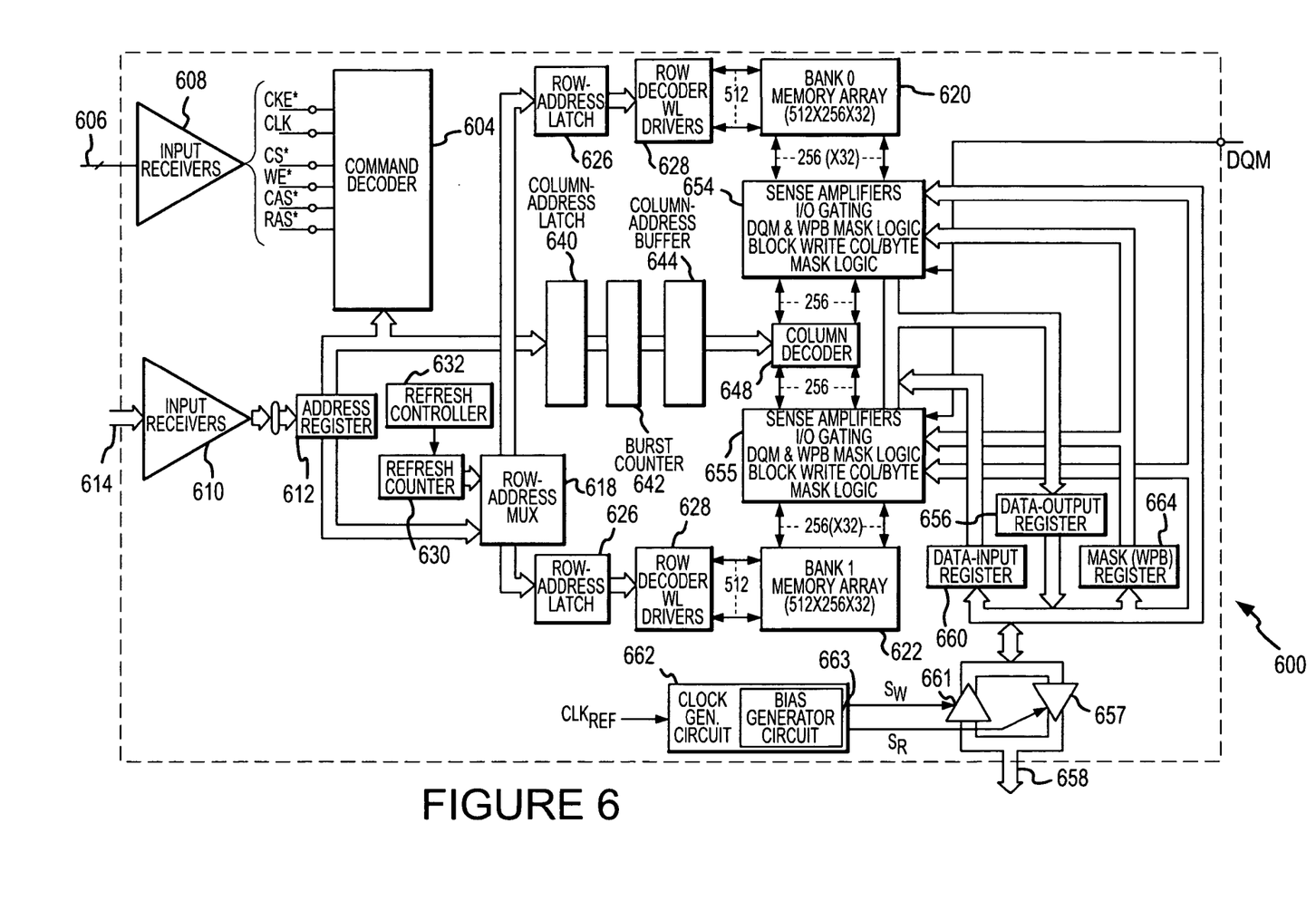
FIG. 6 is a functional block diagram of a memory device having a DLL including a bias generator circuit in accordance with an embodiment of the invention.

FIG. 6 illustrates a synchronous dynamic random access memory ("SDRAM") having a DLL 662 that includes a bias generator circuit 663 according to an embodiment of the invention. The SDRAM 600 includes a command decoder 604 that controls the operation of the SDRAM 600 responsive to high-level command signals received on a control bus 606 and coupled thorough input receivers 608. These high level command signals, which are typically generated by a memory controller (not shown in FIG. 6), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 604 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 600 includes an address register 612 that receives row addresses and column addresses through an address bus 614. The address bus 614 is generally coupled through input receivers 610 and then applied to a memory controller (not shown in FIG. 6). A row address is generally first received by the address register 612 and applied to a row address multiplexer 618. The row address multiplexer 618 couples the row address to a number of components associated with either of two memory banks 620, 622 depending upon the state of a bank address bit forming part of the row address. Associated with each of the memory banks 620, 622 is a respective row address latch 626, which stores the row address, and a row decoder 628, which decodes the row address and applies corresponding signals to one of the arrays 620 or 622. The row address multiplexer 618 also couples row addresses to the row address latches 626 for the purpose of refreshing the memory cells in the arrays 620, 622. The row addresses are generated for refresh purposes by a refresh counter 630, which is controlled by a refresh controller 632. The refresh controller 632 is, in turn, controlled by the command decoder 604.

After the row address has been applied to the address register 612 and stored in one of the row address latches 626, a column address is applied to the address register 612. The address register 612 couples the column address to a column address latch 640. Depending on the operating mode of the SDRAM 600, the column address is either coupled through a burst counter 642 to a column address buffer 644, or to the burst counter 642 which applies a sequence of column addresses to the column address buffer 644 starting at the column address output by the address register 612. In either case, the column address buffer 644 applies a column address to a column decoder 648.

Data to be read from one of the arrays 620, 622 is coupled to the column circuitry 654, 655 for one of the arrays 620, 622, respectively. The data is then coupled through a data output register 656 and data output drivers 657 to a data bus 658. The data output drivers 657 apply the read data to the data bus 658 responsive to a read data strobe signal SR generated from a delayed clock signal produced by the clock generating circuit 662. As previously discussed, the clock generating circuit 662 includes a bias generator circuit 663 according to an embodiment of the invention. The SDRAM 600 shown in FIG. 6 is a double data rate ("DDR") SDRAM that inputs or outputs data twice each clock period. The clock generating circuit 662 receives the reference clock CLKREF signal and generates the read data strobe SR responsive to a delayed clock signal generated by the voltage controlled delay line 504 (FIG. 4).

Data to be written to one of the arrays 620, 622 are coupled from the data bus 658 through data input receivers 661 to a data input register 660. The data input receivers 661 couple the write data from the data bus 658 responsive to a write data strobe signal SW. The write data are coupled to the column circuitry 654, 655 where they are transferred to one of the arrays 620, 622, respectively. A mask register 664 responds to a data mask DM signal to selectively alter the flow of data into and out of the column circuitry 554, 655, such as by selectively masking data to be read from the arrays 620, 622.

Figure 7:
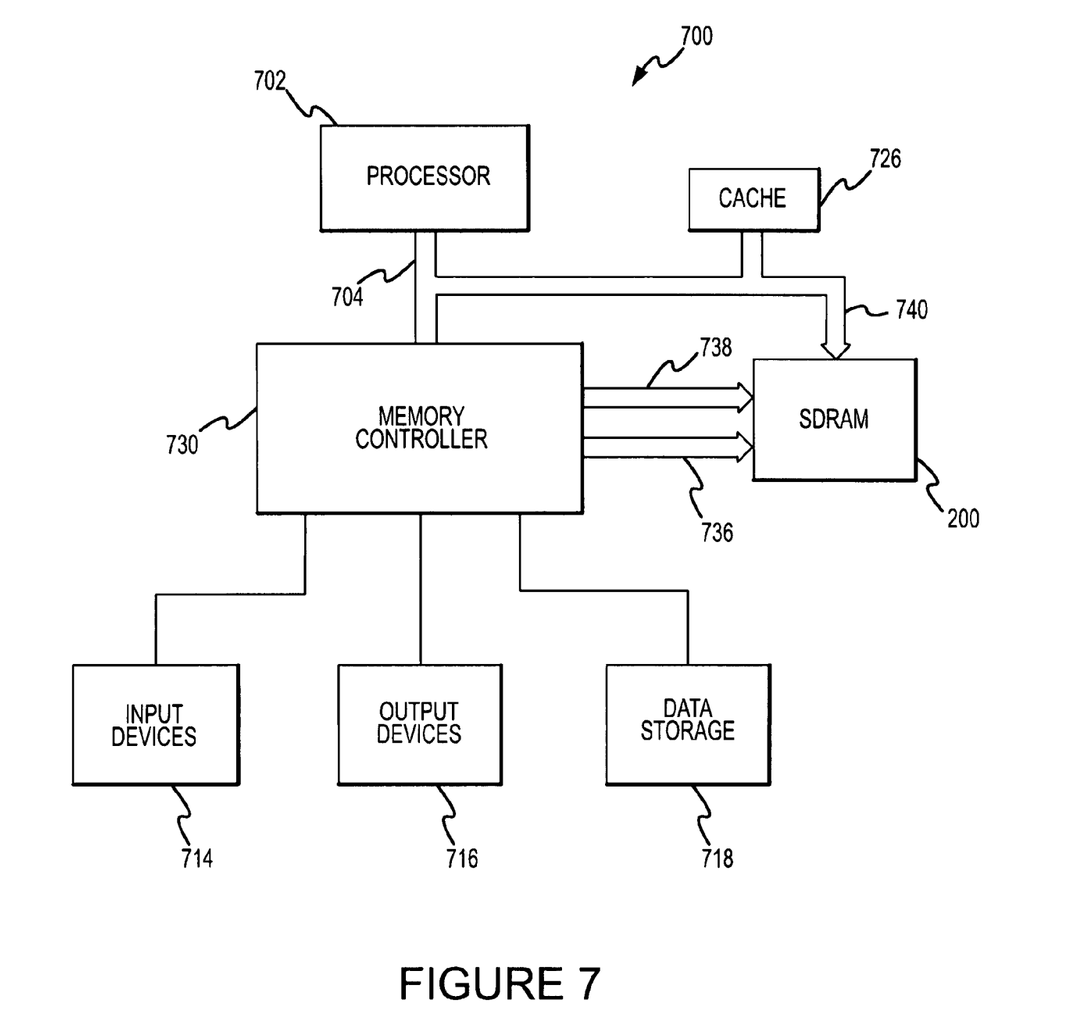
FIG. 7 is a functional block diagram of a processor based system having the memory device shown in FIG. 6.

The SDRAM 600 shown in FIG. 6 can be used in various electronic systems. For example, it may be used in a processor-based system, such as a processor-based system 700 shown in FIG. 7. The processor-based system 700 includes a processor 702 for performing various computing functions, such as executing specific software to perform specific calculations or tasks. The processor 702 includes a processor bus 704 that normally includes an address bus, a control bus, and a data bus. In addition, the processor-based system 700 includes one or more input devices 714, such as a keyboard or a mouse, coupled to the processor 702 to allow an operator to interface with the processor-based system 700. Typically, the processor-based system 700 also includes one or more output devices 716 coupled to the processor 702, such output devices typically being a printer or a video terminal. One or more data storage devices 718 are also typically coupled to the processor 702 to allow the processor 702 to store data in or retrieve data from internal or external storage media (not shown). Examples of typical storage devices 718 include hard and floppy disks, tape cassettes, and compact disk read-only memories (CD-ROMs). The processor 702 is also typically coupled to cache memory 726, which is usually static random access memory ("SRAM"), and to the SDRAM 600 through a memory controller 730. The memory controller 730 normally includes a control bus 736 and an address bus 738 that are coupled to the SDRAM 600. A data bus 740 is coupled from the SDRAM 600 to the processor bus 704 either directly (as shown), through the memory controller 730, or by some other means.

It is to be understood that even though various embodiments and advantages of the present invention have been set forth in the foregoing description, the above disclosure is illustrative only, and changes may be made, and yet remain within the broad principles of the invention. For example, the bias generator 404 illustrated in FIG. 4 was described as varying the voltage of the IBIAS signal 407 by decreasing the voltage. However, in an alternative embodiment, the IBIAS signal 407 is varied by increasing the voltage from the initial voltage. Such modifications to the bias generator 404 can be made without departing from the scope of the present invention. The present invention is to be limited only by the appended claims.

What is claimed is:

1. A bias generator circuit comprising:
an edge detector circuit having a clock input coupled to receive a clock signal and further having an output at which an activation signal is provided, the edge detector circuit configured to generate the activation signal having a first logic level until a specified edge of the clock signal is detected, at which time the edge detector circuit generates the activation signal having a second logic level during at least some of a plurality of subsequent edges of the clock signal;
a voltage divider circuit coupled between a voltage supply and ground, the voltage divider circuit configured to establish an initial bias voltage at a bias node, the bias node selectively coupled to an output node while the activation signal is at the first logic level and being isolated from the output node responsive to the activation signal having the second logic level; and
a discharge switch coupled between the bias node and a voltage node having a voltage different than the initial bias voltage, the discharge switch having a control node coupled to receive the activation signal, the discharge switch configured to couple the bias node to the voltage node in response to the activation signal having the first logic level.

2. The bias generator of claim 1 wherein the voltage node comprises a ground node.

3. The bias generator of claim 1 wherein the edge detector comprises a flip-flop coupled to receive the clock signal, the flip-flop configured to generate the activation signal having the second logic level in response to being clocked by a rising edge of the clock signal.

4. The bias generator of claim 1 wherein the voltage divider circuit comprises first and second diode-coupled transistors.

5. The bias generator of claim 1 wherein the discharge switch comprises a voltage controlled impedance device.

6. The bias generator circuit of claim 1 wherein the initial voltage is equal to approximately one-half of a supply voltage.

7. The bias generator circuit of claim 1 wherein the bias generator circuit is operable to change the magnitude of the bias voltage from the initial voltage until the specified edge of the clock signal is detected.

8. A bias generator circuit comprising:
an edge detector circuit having a clock input to receive a clock signal and further having an output at which an activation signal is provided, the edge detector circuit configured to generate the activation signal having a first logic level until a specified edge of the clock signal is detected, at which time the edge detector circuit generates the activation signal having a second logic level during at least some of a plurality of subsequent edges of the clock signal;
a voltage divider circuit coupled between a first supply and a second voltage, the voltage divider circuit configured to establish an initial bias voltage at a bias node;
a switch connected between the bias node and an output terminal, the switch being operable to couple the bias node to the output terminal responsive to the activation signal having the first logic level and being operable to isolate the bias node from the output terminal responsive to the activation signal having the second logic level; and
a circuit having a reset input and an output coupled to the bias node, the circuit being operable responsive to a reset signal applied to the reset input having a third logic level to change the magnitude of the bias voltage at the bias node from the initial bias voltage.

9. The bias generator circuit of claim 8 wherein the edge detector is coupled to receive the reset signal, the edge detector being operable to switch the activation signal from the second logic level to the first logic level responsive to the reset signal having a fourth logic level that is different from the third logic level.

10. The bias generator circuit of claim 8 wherein the voltage node comprises a ground node.

11. The bias generator of claim 8 wherein the edge detector comprises a flip-flop coupled to receive the clock signal, the flip-flop configured to generate the activation signal having the second logic level in response to being clocked by a rising edge of the clock signal.

12. The bias generator of claim 11 wherein the flip-flop is coupled to receive the reset signal, and is configured to switch the activation signal from the second logic level to the first logic level responsive to the reset signal having the fourth logic level.

13. The bias generator of claim 8 wherein the voltage divider circuit comprises first and second diode-coupled transistors.

14. The bias generator of claim 8 wherein the discharge switch comprises a voltage controlled impedance device.

15. A method of generating a bias voltage, comprising:
generating an activation signal having a first logic level;
detecting a specified edge of a clock signal;
in response to detecting the specified edge of the clock signal, switching the activation signal from the first logic level to a second logic level that is different from the first logic level, the activation signal remaining at the second logic level during at least some of a plurality of subsequent edges of the clock signal;
establishing an initial bias voltage at a bias node;
coupling the bias node to an output terminal responsive to the activation signal having the first logic level; and
isolating the bias node from the output terminal responsive to the activation signal having the second logic level.

16. The method of claim 15, further comprising changing the magnitude of the bias voltage at the bias node from the initial bias voltage after the bias node has been coupled to the output terminal responsive to the activation signal having the first logic level.

17. The method of claim 16, further comprising switching the activation signal from the second logic level to the first logic level at substantially the same time that the magnitude of the bias voltage at the bias node begins to change from the initial bias voltage.

18. The method of claim 15 wherein the magnitude of the initial bias voltage is approximately one half the magnitude of a supply voltage.

* * * * *